(12) United States Patent
Ikeda

(10) Patent No.: US 8,324,506 B2
(45) Date of Patent: Dec. 4, 2012

(54) PRINTED WIRING BOARD AND A METHOD OF PRODUCTION THEREOF

(75) Inventor: Tomoyuki Ikeda, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/641,498

(22) Filed: Dec. 18, 2009

(65) Prior Publication Data
US 2010/0089632 A1    Apr. 15, 2010

Related U.S. Application Data

(63) Continuation of application No. 12/115,286, filed on May 5, 2008, now Pat. No. 7,786,390, which is a continuation of application No. PCT/JP2007/053455, filed on Feb. 20, 2007.

(30) Foreign Application Priority Data

Feb. 22, 2006    (JP) ................................. 2006-044968

(51) Int. Cl.
  *H05K 1/03*    (2006.01)
(52) U.S. Cl. ...................................................... 174/255
(58) Field of Classification Search .......... 361/600–837; 174/261, 262, 255
See application file for complete search history.

(56) References Cited

U.S. PATENT DOCUMENTS

| | | | |
|---|---|---|---|
| 4,706,167 A | 11/1987 | Sullivan | ........................ 361/774 |
| 5,117,069 A | 5/1992 | Higgins, III | .................. 174/261 |
| 6,010,769 A | 1/2000 | Sasaoka et al. | ............... 428/209 |
| 6,400,172 B1 | 6/2002 | Akram et al. | |
| 7,211,899 B2 * | 5/2007 | Taniguchi et al. | ............. 257/774 |
| 7,285,305 B2 * | 10/2007 | Furusawa et al. | ............. 427/117 |
| 7,378,602 B2 | 5/2008 | Ikeda | |
| 2003/0135994 A1 | 7/2003 | Shutou et al. | |
| 2003/0137056 A1 | 7/2003 | Taniguchi et al. | |

(Continued)

FOREIGN PATENT DOCUMENTS

JP    3-188696 A    8/1991

(Continued)

OTHER PUBLICATIONS

U.S. Appl. No. 12/641,430, filed Dec. 18, 2009, Ikeda.

(Continued)

*Primary Examiner* — Jeremy Norris
*Assistant Examiner* — Tremesha S Willis
(74) *Attorney, Agent, or Firm* — Oblon, Spivak, McClelland, Maier & Neustadt, L.L.P.

(57) ABSTRACT

A printed wiring board has an insulating resin substrate having a first surface and a second surface, the insulating resin substrate having one or more penetrating-holes passing through the insulating resin substrate from the first surface to the second surface, a first conductor formed on the first surface of the insulating resin substrate, a second conductor formed on the second surface of the insulating resin substrate, and a through-hole conductor structure formed in the penetrating-hole of the insulating resin substrate and electrically connecting the first conductor and the second conductor. The penetrating-hole has a first portion having an opening on the first surface and a second portion having an opening on the second surface. The first portion and the second portion are connected such that the first portion and the second portion are set off from each other.

20 Claims, 8 Drawing Sheets

U.S. PATENT DOCUMENTS

| | | |
|---|---|---|
| 2006/0021794 A1 | 2/2006 | Cheng |
| 2007/0155174 A1 | 7/2007 | Taniguchi et al. |
| 2008/0296056 A1 | 12/2008 | Kinoshita et al. ............ 174/261 |

FOREIGN PATENT DOCUMENTS

| | | |
|---|---|---|
| JP | 4-154187 | 5/1992 |
| JP | 7-115272 A | 5/1995 |
| JP | 11-121923 A | 4/1999 |
| JP | 2000-216514 | 8/2000 |
| JP | 2003-46248 A | 2/2003 |
| JP | 2003-218519 A | 7/2003 |
| JP | 2003-218525 A | 7/2003 |
| JP | 2004-311919 | 11/2004 |
| JP | 2004-335655 A | 11/2004 |
| JP | 2004-363212 | 12/2004 |

OTHER PUBLICATIONS

"PWB $CO_2$ Laser Drilling Machine", Hitachi Via Mechanics, Ltd., Jun. 2003, 4 Pages. (with an English Translation).

"Mitsubishi Changes for the Better", Mitsubishi Electric Corporation, Nov. 10, 2004, 2 Pages (with an English Translation).

* cited by examiner

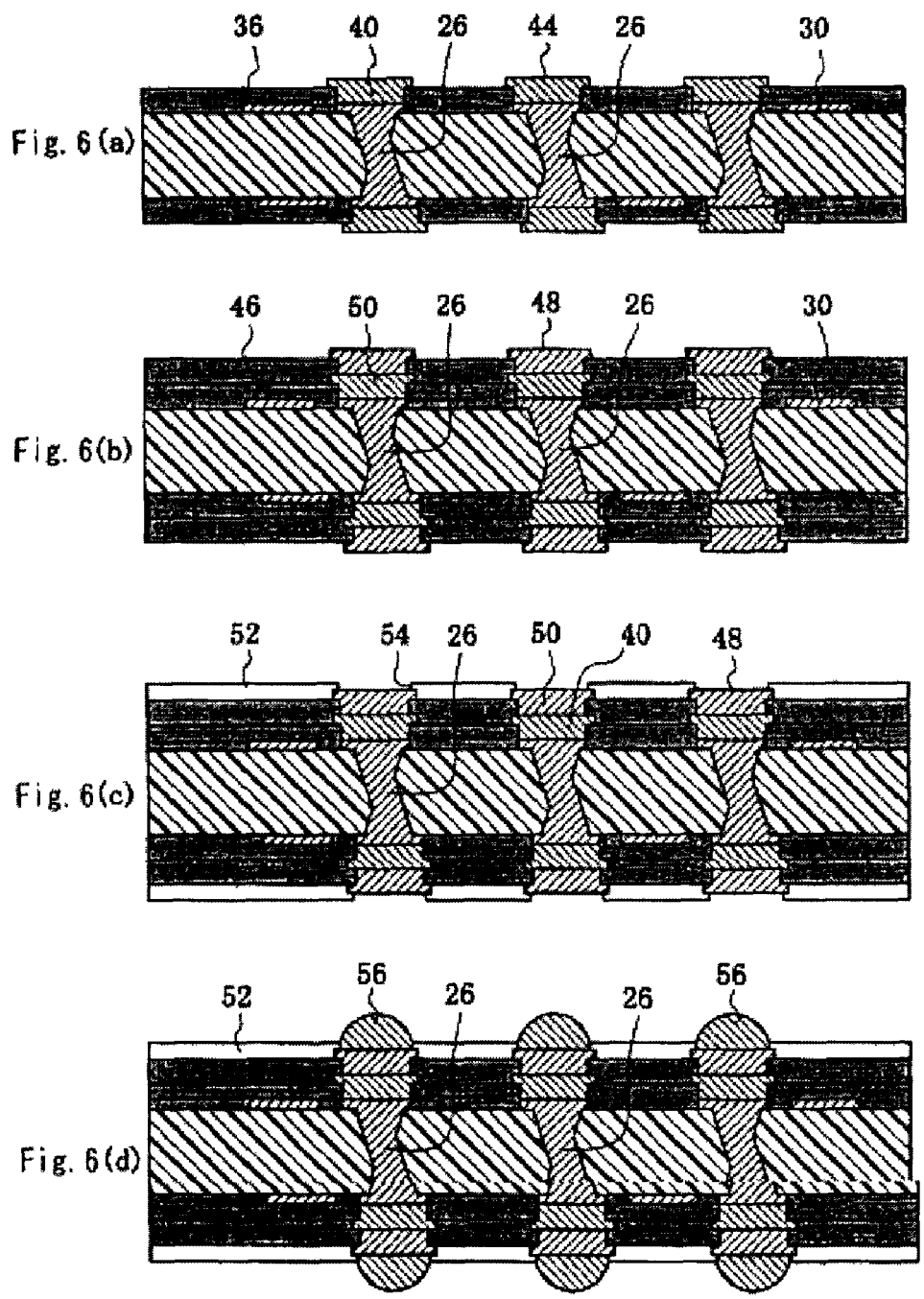

BACKGROUND ART

PRINTED WIRING BOARD AND A METHOD OF PRODUCTION THEREOF

CROSS-REFERENCE TO RELATED APPLICATIONS

The present application is a continuation of U.S. Ser. No. 12/115,286, filed May 5, 2008, which is a continuation of PCT/JP2007/053455, filed Feb. 20, 2007, which claims the benefit of priority to Japanese Patent Application No. 2006-044968, filed Feb. 22, 2006. The contents of each of these applications are incorporated herein by reference in their entirety.

BACKGROUND OF THE INVENTION

1. Field of the Invention

The present invention is related to a printed wiring board in which a plated conductor or plated conductors are formed in penetrating-holes formed in an insulating material, and specifically to a printed wiring board having a plated conductor with improved conduction and a substrate with improved strength, and a method of producing such a printed wiring board.

2. Discussion of the Background

In a conventional printed wiring board, filled-type through-holes are formed by plating a metal in penetrating-holes formed in an insulating resin substrate. These filled-type through-holes are formed as plated through-holes for electrically connecting conductor circuits formed on the front and back surfaces of the insulating resin substrate in the printed wiring board.

For example, Japanese Unexamined Patent Publication No. 2004-311919 describes a method of forming through-holes. To form a through-hole, a penetrating-hole 2 is formed in an insulating resin substrate 1 as shown in FIG. 9(*a*), and a seed layer 3 made of metal is formed by electroless plating on a surface of the insulating resin substrate 1, including the inner wall of the penetrating-hole 2 as shown in FIG. 9(*b*). Then, electrolytic plating is performed to form an electrolytic plated layer 4 on the seed layer 3 as shown in FIG. 9(*c*), and by further performing the electrolytic plating process, a through-hole 6 is formed by filling the penetrating-hole 2 with metal as shown in FIG. 9(*d*). In a through-hole formed in such a method as shown in FIG. 9(*d*), a void 8 is prone to be formed in its inside.

According to another method as shown in FIGS. 10(*a*) to (*b*), a penetrating-hole 2 having a shape symmetrically tapering toward the midpoint of an insulating resin substrate 1 as shown in a vertical cross-section of FIG. 10(*a*) is formed in an insulating resin substrate 1, and a through-hole 6 is formed by filling metal into the penetrating-hole 2, i.e., by performing electroless plating to form a seed layer made of metal and an electrolytic plating process over the seed layer as shown in FIG. 10(*a*) to (*b*).

The contents of the foregoing publication is incorporated herein by reference in their entirety.

SUMMARY OF THE INVENTION

According to one aspect of the present invention, a printed wiring board has an insulating resin substrate having a first surface and a second surface, the insulating resin substrate having one or more penetrating-holes passing through the insulating resin substrate from the first surface to the second surface, a first conductor formed on the first surface of the insulating resin substrate, a second conductor formed on the second surface of the insulating resin substrate, and a through-hole conductor structure formed in the penetrating-hole of the insulating resin substrate and electrically connecting the first conductor and the second conductor. The penetrating-hole has a first portion having an opening on the first surface and a second portion having an opening on the second surface, and the first portion and the second portion are connected such that the first portion and the second portion are set off from each other.

According to another aspect of the present invention, a printed wiring board has a core substrate, a resin insulating layer and an external conductor circuit. The core substrate includes an insulating resin substrate having a first surface and a second surface. The insulating resin substrate has one or more penetrating-holes passing through the insulating resin substrate from the first surface to the second surface. The core substrate further includes a first inner conductor formed on the first surface of the insulating resin substrate, a second inner conductor formed on the second surface of the insulating resin substrate and a through-hole conductor structure formed in the penetrating-hole of the insulating resin substrate and electrically connecting the first conductor and the second conductor. The resin insulating layer is formed over one of the first surface and second surface of the insulating resin substrate of the core substrate. The external conductor circuit is formed over the resin insulating layer and the core substrate. The penetrating-hole has a first portion having an opening on the first surface and a second portion having an opening on the second surface, and the first portion and the second portion are connected such that the first portion and the second portion are set off from each other.

According to yet another aspect of the present invention, a manufacturing method for producing a printed wiring board includes proving an insulating resin substrate having a first surface and a second surface, forming a first portion of a penetrating-hole having an opening on the first surface of the insulating resin substrate, forming a second portion of the penetrating-hole having an opening on the second surface of the insulating resin substrate such that the second portion is connected to the first portion and that the first portion and the second portion are set off from each other, forming a first conductor on the first surface of the insulating resin substrate, forming a second conductor on the second surface of the insulating resin substrate, and forming a through-hole conductor structure formed in the penetrating-hole of the insulating resin substrate to electrically connecting the first conductor and the second conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 6(a) to (d) are cross-section views showing steps for producing a printed wiring board according to an embodiment of the present invention;

DESCRIPTION OF THE EMBODIMENTS

Figure 1:
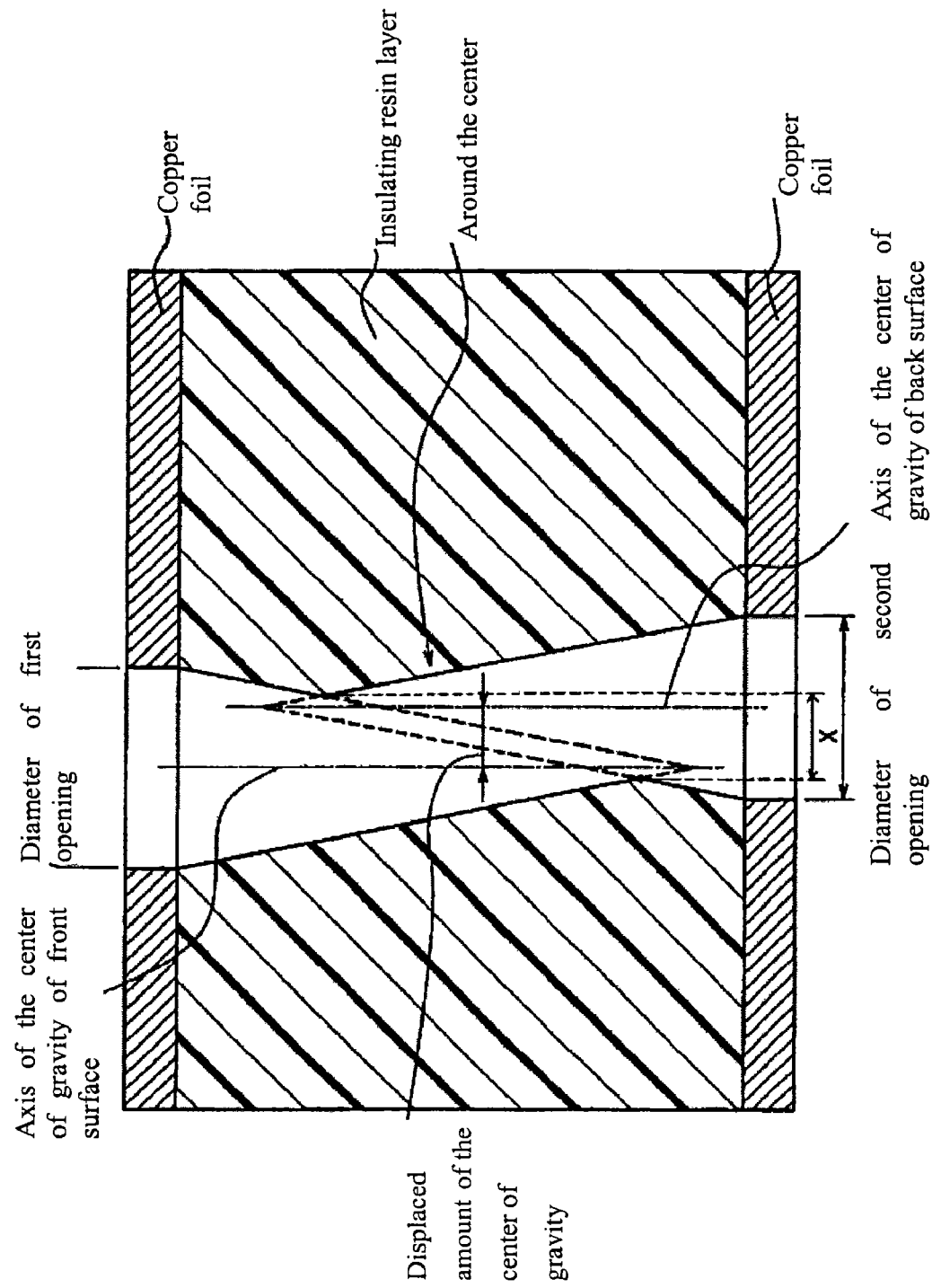
FIG. 1 is a cross-section view showing the shape of a through-hole in a printed wiring board according to an embodiment of the present invention.

The embodiments will now be described with reference to the accompanying drawings, wherein like reference numerals designate corresponding or identical elements throughout the various drawings.

According to an embodiment of the present invention, a printed wiring board has a through-hole (also referred to as a "through-hole conductor" or a "through-hole conductor structure") which is formed in an insulating resin substrate by forming a plated conductor inside a penetrating-hole formed in the insulating resin substrate, the through-hole has a first opening on the front surface of the insulating resin substrate and a second opening on the back surface of the insulating resin substrate, and the first and second openings have the axes of their centers of gravity which are out of alignment or off set with each other. The "axis of the center of gravity" is defined herein as a straight line passing through the center of gravity of an opening portion of a through-hole, projecting on the front surface (or back surface) of the substrate or core substrate and making substantively perpendicular to the front surface (or back surface) of the substrate or core substrate (for example, in FIG. 1, a straight line passing a first or a second opening on the first or the second surface of the substrate or core substrate and making substantively perpendicular to the first surface or the second surface of the substrate or core substrate). Such a printed wiring board may be used as a core substrate for a multilayer printed wiring board with multiple conductor layers and resin insulating layers alternatively formed on the core substrate.

By setting the axes of the centers of gravity of the opening portions of a penetrating-hole projecting on the front and back surfaces of an insulating resin substrate out of alignment or off set, the area of the neck portion of the through-hole (i.e., the cross-section area that is cut by a plane parallel to the front or back surface of the insulating resin substrate is minimized) becomes out of alignment; therefore, even when the insulating resin substrate is warped, the area on which stress is applied becomes wider for the amount of misalignment of the neck portion. Also, because the front surface of the core substrate and planes made by connecting the centers of gravity of neck portions of through-holes do not come in alignment with each other, the stress is reduced, making it difficult for cracks to form around the neck portions. Consequently, poor connection due to cracking becomes less likely to occur, and mechanical strength of the substrate is improved.

Alternatively, the through-holes may be formed so that the centers of gravity of the neck portions differ among adjacent through-holes.

In addition, because the cross-sectional area becomes larger around the neck portion of the through-hole, the conduction resistance decreases and the electric property of the substrate improves.

In addition, in a multilayer printed wiring board according to an embodiment of the present invention, it is preferable to form in a part of the outermost conductor layer pads for connecting bumps at a predetermined pitch and to keep out-of-alignment or misalignment of the centers of gravity for through-holes projected on the front and back surfaces of the insulating resin substrate as well as to form the pitch between adjacent through-holes similar to the pitch of the pads for connecting bumps.

As an insulating resin substrate used in an embodiment according to the present invention, it is preferable to use a hard substrate selected from a glass cloth epoxy resin substrate, glass cloth bismaleimide-triazine resin substrate, glass cloth polyphenylenether resin substrate, non-woven aramid-epoxy resin substrate, and non-woven aramid-polyimide resin material, more preferably a glass cloth epoxy resin substrate.

The thickness of an insulating resin substrate is preferably about 100-500 µm. If the thickness is less than 100 µm, the rigidity becomes insufficient, and if it is thicker than 500 µm, plating into a through-hole or through-holes becomes difficult, which may result in voids in plating.

Conductor circuits formed on both surfaces of an insulating resin substrate is, as described later, preferably formed after plating through-holes and by etching on a metal foil laminated on both sides of the insulating resin substrate and the plated layer formed thereon.

For a substrate having an insulating resin substrate and a metal foil, a double-sided copper clad laminate obtained by laminating and heat-pressing prepreg and cooper foils. The prepreg may be a B stage prepreg obtained by impregnating glass cloth with epoxy resin. Such a substrate has good positioning accuracy, because there is no displacement of a wiring pattern or via positions during handling after copper foils are etched.

Referring to FIG. 1, a through-hole according to an embodiment of the present invention has a first opening portion having a shape in which the diameter decreases inward from one side of an insulating substrate and a second opening portion having a shape in which the diameter decreases inward from the other side of the insulating substrate, and the second opening portion is connected to the first opening portion around the mid point between the surfaces of the insulating resin material. A neck portion is formed at the point at which the first opening portion and the second opening portion coincide. In other words, a penetrating-hole having a shape of two connecting truncated cones is filled with plating and is out of alignment along the substrate surface direction by a predetermined distance. The axes of the centers of gravity (straight lines passing through the centers of gravity of the first opening portion and the second portion and making substantively perpendicular to the front (and back) surface of the substrate) of the first opening portion and second opening portion each projecting through one side and the other side of the insulating resin substrate are out of alignment with each other.

It is preferable to form the through-hole described above by laser processing a penetrating-hole having a first opening portion and a second portion, and then by filling the penetrating-hole with metal plating.

Furthermore, to improve the degree of efficiency of absorbing the laser beam during the laser processing, it is preferable to perform a black oxide process on the metal foil on the insulating resin substrate in advance.

To form a penetrating-hole for forming a through-holes with laser processing, first, a laser is irradiated from a predefined position toward one side of an insulating resin substrate to form a first opening portion in which the diameter decreases inward from the one side of the insulating resin substrate and that extends around the center from the one side of the insulating resin substrate. Then, to a position out of alignment from the predefined position and on the other side of the insulating resin substrate across from the predefined position, a laser is irradiated on the other surface of the insulating resin substrate. It is preferable to form a penetrating-hole for forming a through-hole by connecting the first opening portion and the second opening portion around the center of the insulating resin substrate, and the second opening portion is formed whereby its diameter decreases inward from the other surface of the insulating resin substrate and extends around the center from the other surface of the insulating resin substrate.

To form a penetrating-hole for the formation of a through-hole by using laser in an insulating resin substrate, there are, for example, two methods: the direct laser method for piercing both a metal foil and an insulating resin substrate at the same time with laser irradiation, and the conformal method for penetrating an insulating resin substrate with laser irradiation after removing a part of a metal foil by etching.

It is preferable to perform the laser process described above with a pulse-oscillating type carbonic acid gas laser device. The process conditions may be determined by a shape of a penetrating-hole (the first opening portion and the second opening portion) for forming a through-hole in which the diameter decreases inward from the surface of the insulating resin substrate, i.e., the angle defined by the surface of the insulating resin substrate and the side wall of a penetrating-hole (hereinafter referred to as a "taper angle"), and the depth of the penetrating-hole.

For example, by using on the pulse interval in a range of 10-20 µs and the number of shots in a range of 1-5, the taper angle and the depth of a penetrating-hole for forming a through-hole may be adjusted.

Furthermore, a penetrating-hole for forming a through-hole formed under the process condition described above, the diameter (shown by the reference character "X" in FIG. 1) of the neck portion inside the insulating resin substrate is preferably 50-250 µm. If the diameter is less than 50 µm, it is too narrow, so the connection reliability of a through-hole filled with plating is poor. If the diameter is more than 250 µm, it is prone to cause voids in a through-hole filled with plating. Therefore, within the range described above, it is less likely that a through-hole has voids, providing superior connection reliability.

Figure 7:
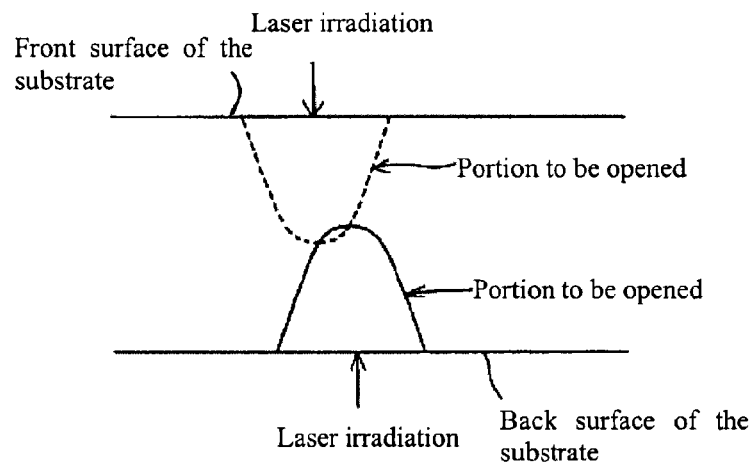
FIGS. 7(a) to (b) are cross-section views showing deformation where the centers of gravity of a through-hole is considerable.
Figure 7:
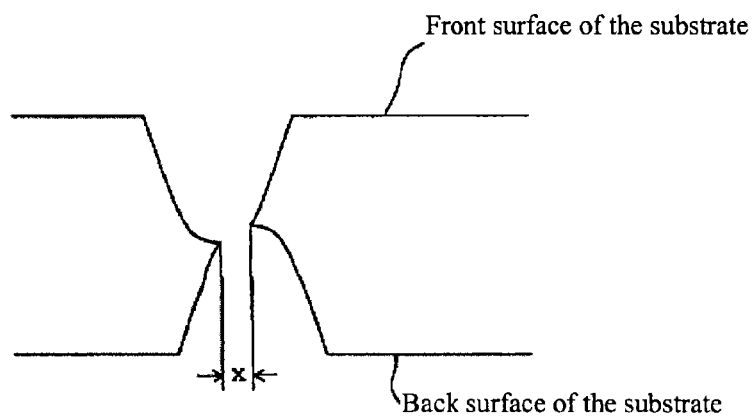

Moreover, for the misalignment of the centers of gravity for a penetrating-hole for forming a through-hole described above is preferably within a range of 5-30 µm. If the misalignment is less than 5 µm, the stress reduction effect is small. If the misalignment is more than 30 µm, the shape of a penetrating-hole becomes prone to deformation as shown in FIGS. 7(a) to (b).

In addition, the pitch between adjacent through-holes is preferably 100-400 µm. If the pitch is less than 100 µm, the insulation reliability is low. If the pitch is more than 400 µm, it is not suitable for fining.

Still further, it is preferable to perform the desmear process to remove resin residue left on the side of a penetrating-hole formed by laser irradiation. This desmear process may be performed by a wet process such as a chemical reaction of acids or oxidants (e.g., chromic acid, hydrogen permanganate), by a dry process such as oxygen plasma discharge treatment, corona discharge treatment, ultra violet laser processing, or by an excimer laser process.

A particular method among these desmear process methods may be selected depending on the type or thickness of an insulating substrate, the opening diameter of a via-hole, or the laser irradiation conditions, considering the smear amount expected to be left.

In an embodiment according to the present invention, a through-hole may be formed by filling with plating in a penetrating-hole. For example, an electroless plated film may be formed by normal nonelectrolytic plating on the inner wall of the penetrating-hole, and then the through-hole may be filled with plating via an electrolytic plating process such as the sparger plating method, which causes the plating solution to flow onto the substrate.

For the nonelectrolytic plating or electrolytic plating described, it is preferable to have metal plating such as copper, tin, silver, various types of solder, copper/tin and copper/silver, and, nonelectrolytic copper plating or electrolytic copper plating is preferable.

In an embodiment according to present invention, a conductor circuit may be formed on both sides of an insulating resin substrate via an etching process of a conductor layer formed at the time when the plated through-holes is formed.

In this conductor circuit formation process, first, photosensitive dry film resist is laminated onto the surface of the conductor layer, and then exposed according to a predefined circuit pattern and developed to form an etching resist, and by etching a part or parts of the conductor layer where etching resists are not formed, a conductor circuit pattern including electrode pads may be formed.

In the process described above, for an etching solution, at least one type of aqueous solution may be used among sulfuric acid hydrogen peroxide, peroxosulfates, copper chloride, or iron chloride.

Furthermore, as a pre-process for forming a conductor circuit by etching the conductor layer described above, to make fine pattern formation easier, the thickness may be 1-10 µm, or more preferably about 2-8 µm, by etching the entire surface of the conductor layer in advance.

With such a printed wiring board as a core substrate, a multi-layer printed wiring board may be formed by forming a build-up wiring layer by alternately forming a conductor layer and a resin insulating layer on the core substrate according to a normal method.

In such a multi-layer printed wiring board, it is preferable to make a part or parts of the outermost conductor layer pads for connecting bumps with a predetermined pitch similar to the pitch between adjacent through-holes filled with plating in the core substrate. With this structure, the wiring resistance via chips to be mounted on PKG may be reduced so that it has the advantage of ensuring a power supply.

Below is a description of an exemplary method for producing a printed wiring board according to an embodiment of the present invention.

(1) To produce a printed wiring board according to an embodiment of the present invention, an insulating resin substrate laminated with copper foils on both sides may be used as a starting material.

For an insulating resin substrate, a hard laminated substrate may be selected from glass cloth epoxy resin substrate, glass cloth bismaleimide-triazine resin substrate, glass cloth polyphenylenether resin substrate, non-woven aramid-epoxy resin substrate, and non-woven aramid-polyimide resin material, preferably a glass cloth epoxy resin substrate.

The thickness of the insulating resin substrate is preferably in the range of about 100-500 μm. If the thickness is less than 100 μm, rigidity is insufficient. If the thickness is more than 500 μm, it is difficult to fill plating in a penetrating-hole, which may cause voids.

To form a penetrating-hole for forming a through-hole by using a laser in the insulating resin substrate, there may be two methods: the direct laser method for penetrating both the copper foil and the insulating resin substrate at the same time by laser irradiation, and the conformal method for penetrating the insulating resin substrate with laser irradiation after a part of the metal foil for a penetrating-hole is removed by etching. The thickness of this copper sheet may be adjusted by half-etching.

A double-sided copper clad laminate may be used for the insulating resin substrate with copper foils. Such a laminate may be obtained by impregnating a glass cloth with epoxy resin and laminating and heat pressing a copper foil.

This is because such a laminate provides good position accuracy, as there is no displacement of the wiring pattern or via position during the process after the copper sheets are etched.

(2) Next, a penetrating-hole for forming a through-hole is made in the insulating resin substrate by laser processing.

When using a double-sided copper clad laminate to form a circuit substrate, first, laser irradiation is performed from a predefined position toward the metal foil laminated on one surface of the insulating resin substrate to pass through the metal foil so as to form a first opening position having the diameter decreasing inward from the one surface of the insulating resin substrate and extending from the one surface to near the center part of the insulating resin substrate. Alternatively, after forming a hole in which the diameter is nearly the same as the diameter of the through-hole on the surface by etching in advance at a predefined position of one side of the copper foil surface laminated on the insulating resin substrate (mask for laser), $CO_2$ gas laser irradiation is performed using the hole as an irradiation mark to form a first opening portion in which the diameter decreases inward the insulating resin substrate and that extends from the one surface of the insulating resin substrate to near the center part.

Next, on a position out of alignment or off set by a predetermined distance on the other surface of the insulating resin substrate facing the predetermined position, laser irradiation is performed toward the metal foil laminated on the other surface of the insulating resin substrate, so as to form a second opening position in which the diameter decreases inward from the other surface of the insulating resin substrate and that extends from the other surface to near the center part of the insulating resin substrate. Alternatively, after forming a hole whose diameter is almost same as the diameter of the through-hole on the surface by etching in advance at a predefined position of the other side of the copper foil surface laminated on the insulating resin substrate (a mask for laser), $CO_2$ gas laser irradiation is performed using the hole as an irradiation mark to form a second opening portion in which the diameter decreases inward the insulating resin substrate and that extends from the other surface of the insulating resin substrate to near the center part.

Figure 2:
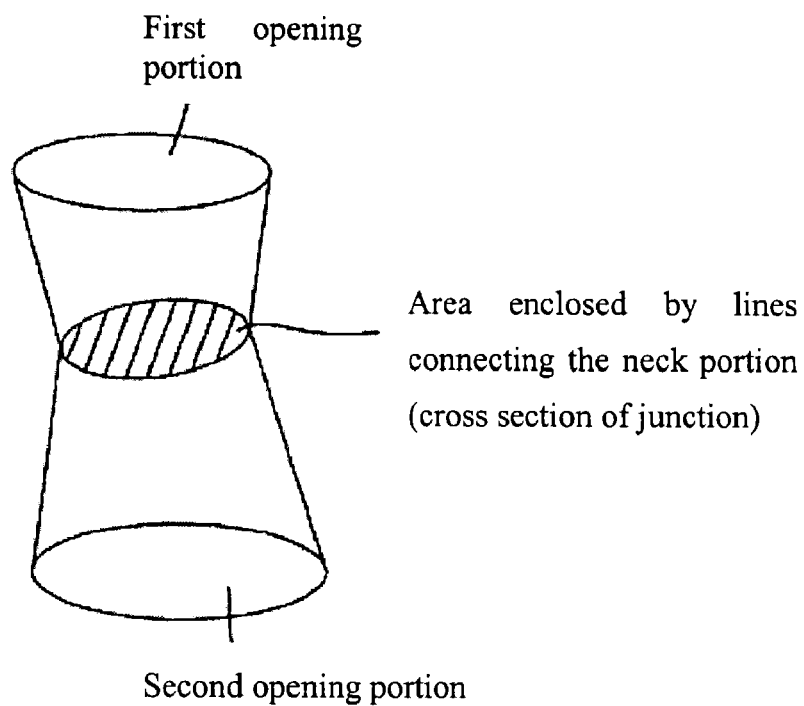
FIG. 2 is a schematic view showing the cross-section of a neck portion of the through-hole shown in FIG. 1.

When forming this second opening portion, the distance between the centers of gravity of the first opening portion and the second opening portion (misalignment distance) is adjusted in accordance with the positions of laser irradiation so that the first opening portion and the second opening portion is connected around the center part of the insulating resin substrate to form a penetrating-hole for forming a through-hole and that the plane area enclosed by a line connecting the neck portion is not parallel to the surfaces of the substrate (refer to FIG. 2).

The laser processing described above is performed with a pulse-oscillating type carbonic acid gas laser device, and the processing conditions may be determined by the shape of a penetrating-hole for forming a through-hole in which the diameter decreases inward from the surface of the insulating resin substrate, for example, the pulse interval of 10-20 μs and the shots of 1-5 times.

With such laser processing conditions, the diameter of openings (the opening diameter of the first opening portion and the second opening portion) of a penetrating-hole for forming a through-hole may be set to be in a range of 75-300 μm and the shortest diameter of the neck portion may be set to be in a range of 50-250 μm, and the out-of-alignment distance of the centers of gravity for a penetrating-hole for forming a through-hole may be set in a range of 5-30 μm.

(3) The desmere process is performed to remove resin residues left on the side wall of the penetrating-hole formed in the step (2) described above.

This desmear process may be performed by wet processing such as chemical reaction of acids or oxidants (e.g., chromic acid, hydrogen permanganate), by dry processing such as oxygen plasma discharge treatment, corona discharge treatment, ultra violet laser processing or by excimer laser processing.

(4) Then, nonelectrolytic plating process is performed to form an electroless plated film on the inner wall of the penetrating-hole for a through-hole and on the copper foil. In this case, the electroless plated film may be made by using metals such as copper, nickel or silver.

(5) In addition, using the electroless plated film formed in the (4) above as a lead, electrolytic plating process may be performed to form an electrolytic plated film on the electroless plated film covering the copper foil of the substrate and also form a "drum shaped" (a shape of two connecting truncated cones) through-hole by gradually thickening a plated layer formed on the inner wall of the penetrating-hole and by filling the electrolytic plated film inside the penetrating-hole.

(6) Then, an etching resist layer is formed on the electrolytic copper plated film formed on the substrate in the step (5) above. The etching resist layer may be formed by coating a resist solution or laminating a film prepared in advance. On this resist layer, a mask with a circuit drawn in advance is placed, and exposed and developed to form an etching resist layer. A conductor circuit pattern including a through-hole land is formed by etching parts of the metal layer where the etching resist is not formed.

As an etching solution, at least one kind of aqueous solution may be selected from aqueous solution of sulfuric acid hydrogen peroxide, peroxosulfates, copper chloride, and iron chloride.

As a pre-process to form a conductor circuit by the etching process described above, the thickness may be adjusted by etching the entire surface of the electrolytic copper plated film in advance, thereby making the formation of fine patterns easier.

Using a printed wiring board according to an embodiment of the present invention prepared by following the steps (1) to (6) described above as a core substrate, a multilayer printed wiring board may be formed by forming a build-up wiring layer made of alternately laminating insulating resin layers and conductor circuit layers on one side or both sides of the core substrate.

In such a multi-layer printed wiring board, a solder resist layer may be formed on the surface of the insulating resin layer on which the outermost conductor circuit is formed, i.e., the outermost layer of the build-up wiring layer. In this case, a solder resist composition is coated on the entire surface of the outermost layer of the printed wiring board, and after the coated film is dried, a photo mask film on which the opening portions of connection pads are drawn is placed on this coated film and then exposed and developed to expose the connection pad parts. In this case, a solder resist layer made of a dried film may be laminated and then exposed and developed or by irradiated with laser to form openings.

On the connection pads exposed from the solder resist, a corrosion-resistant layer such as nickel-gold may be formed. The thickness of the nickel layer may be preferably 1-7 μm and the thickness of the gold layer may be preferably 0.01-0.1 μm. Other than these metals, nickel-paradium-gold, gold (single layer) or silver (single layer) may be used.

Then, on the connection pads, solder bodies are provided and with melting and solidifying of the solder bodies, solder bumps are formed for a multi-layer circuit substrate.

In the multi-layer printed wiring board formed in the steps described above, parts of the outermost conductor layer is formed as connection pads in a predetermined pitch, and by setting the pitch of these connection pads similar to the pitch between adjacent through-holes filled with plating in the core substrate, the wiring resistant via chips to be mounted on PKG may be reduced, providing an advantage of ensuring power supply.

EXAMPLES

Example 1-1

(1) First, a circuit board (core) which serves as a part of a multi-layer printed wiring board is prepared. This circuit board is the substrate to be the center of multiple insulating layers to be laminated, and a double-sided copper clad laminate 10, which is obtained by impregnating glass cloth with epoxy resin to form a prepreg made as B stage and by heat-pressing copper foils thereto (refer to FIG. 4(*a*)).

The thickness of the insulating resin substrate 12 is 300 μm and the thickness of the copper foils 14 is 3 μm. A copper foil which is thicker than 3 μm may be used for this laminate and the thickness of the copper foils may be adjusted to 3 μm by etching process.

(2) $CO_2$ gas laser irradiation is performed on a predetermined position on the one surface of double-side circuit board 10 to form a first opening portion 16 which passes through one copper foil 14 and extends from the center of the insulating resin substrate 12 to a portion close to the other surface (refer to FIG. 4(*b*)), and also $CO_2$ gas laser irradiation is performed on the position which is out of alignment by 15 μm from the position of the predetermined position on the other surface of double-side circuit board 10 to form a second opening portion 18 which passes through the other copper foil 14 and extends from the center of the insulating resin substrate 12 to a portion close to the opposite surface so as to connect to the first opening portion 16. As a result, by connecting the first opening portion 16 and the second opening portion 18, a penetrating-hole 20 for forming a through-hole is formed.

In this embodiment, to form the penetrating-hole 20 for forming a through-hole, for example, a high peak short pulse oscillating type carbonic acid gas laser processing device (made by Hitachi Via Co., Ltd) may be used under the laser processing conditions in which the pulse interval is 10-20 μs and the number of shots is 1-5. The penetrating-hole 20 is formed with 150 μm pitch, the opening diameter of the first opening portion 16 and the second opening portion 18 is almost 150 μm the diameter of the neck portion around the center of the substrate, i.e., the minimum distance where the diameter is decreased at most (indicated by "X" in FIG. 1) is almost 87 μm, and the out-of-alignment distance between the axes of the centers of gravity of the first opening portion 16 and the second opening portion 18 is 15 μm.

In the penetrating-hole 20 formed under such conditions, the first opening portion 16 and the second opening portion 18, whose center axes are out of alignment with each other, are formed by parts of truncated cones in which the inner walls are making a taper (inner angle) against the surfaces of the insulating resin substrate 12, and connected by the common connecting cross-section around the center of the substrate.

Figure 3:
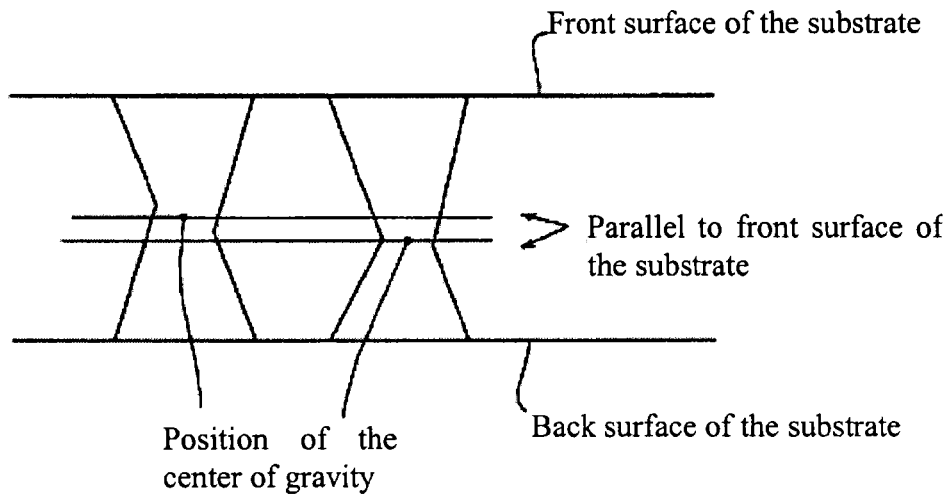
FIG. 3 is a cross-section view showing an example when the position of the center of gravity varies for adjacent through-holes according to an embodiment of the present invention.
Figure 4A:
FIGS. 4(*a*) to (*d*) are cross-section views showing steps for producing a printed wiring board according to an embodiment of the present invention.
Figure 4B:
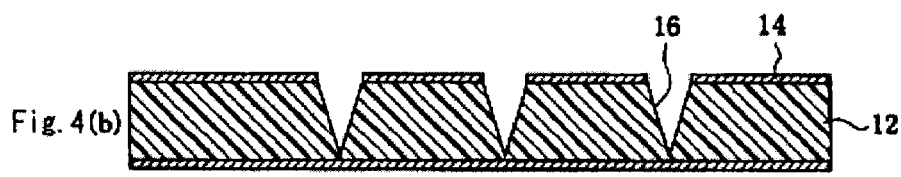
Figure 4C:
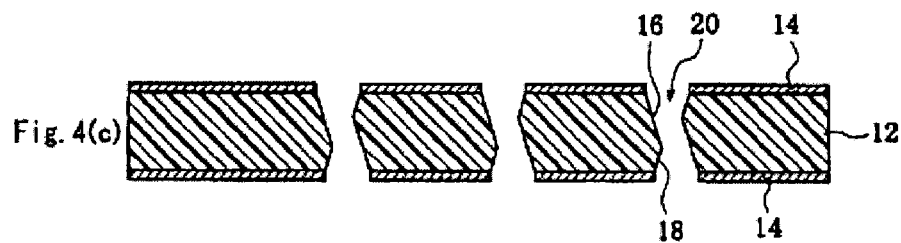
Figure 4D:
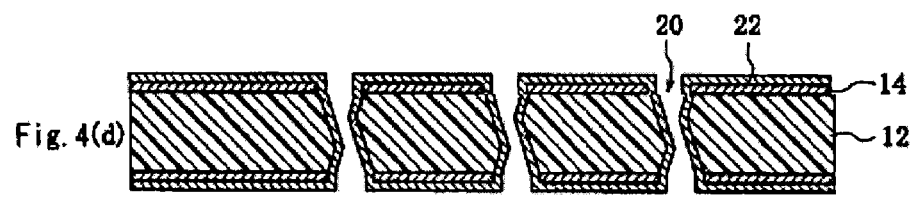

This connecting cross-section (refer to FIG. 2) is not parallel to the surfaces of the insulating resin substrate. In addition, the centers of gravity of adjacent connection cross-sections are preferably out of alignment in the cross-section direction of the insulating resin substrate (refer to FIG. 3).

(3) Then, the desmere process is performed inside the penetrating-hole 20 formed by laser processing to remove resin or particle residue left on the inner wall with a physical methods such as $O_2$ plasma or $CF_4$ plasma. In addition, soft etching process may be performed after washing the desmere-processed substrate with water and subjecting it to acid degreasing.

(4) Next, the desmere-processed substrate is immersed in the electroless copper plating aqueous solution prepared as described below to form the electroless copper plated film 22 having a thickness of 0.6 μm on the entire surface of the copper foil 14 laminated on both sides of the substrate and the inner wall of the penetrating-hole 20 (Refer to FIG. 4(*d*)).

| Electroless copper plating solution | |
|---|---|
| Copper sulfate: | 0.03 mol/l |
| EDTA: | 0.200 mol/l |
| HCHO: | 0.18 g/l |
| NaOH: | 0.100 mol/l |
| α,α'-bipiridyl: | 100 mg/l |
| Polyethleneglycol: | 0.10 g/l |
| Solution temperature: | 30-50° C. |
| Duration: | 40-60 minutes |

(5) Next, after the substrate is washed in 50° C. water for degreasing and washed in 25° C. water, and then washed again with sulfuric acid, electrolysis plating is performed under the condition below to form the electrolysis plated film 24 (refer to FIG. 5(*a*)).

| Electrolysis copper plating solution | |
|---|---|
| Sulfuric acid: | 2.24 mol/l |
| Copper sulfate: | 0.26 mol/l |
| Additive agent: | 19.5 ml/l |
| Leveling agent: | 50 mg/l |
| Gloss agent: | 50 mg/l |

| Electrolysis plating condition | |
| --- | --- |
| Current density: | 1.0 A/dm² |
| Duration: | 30-90 minutes |
| Temperature: | 22 ± 2° C. |

(6) In FIG. 5, the electroless plated film 22 is not shown for simplification. On the substrate on which the electrolytic copper plated film is formed, a film resist layer is attached. And on this resist layer, a mask on which a circuit or circuits are drawn in advance is positioned, and exposed and developed to form an etching resist layer 28 (refer to FIG. 5(b)). Then by etching parts of the metal layer where the etching resists is not formed, an inner layer conductor circuit 30 having a thickness of 20-30 μm is formed on the front and back surface of the insulating resin substrate. Also, a through-hole land 32 positioning on top of the through-hole 26 is formed. Thus, a core substrate is formed (refer to FIG. 5(c)).

The wiring is formed with 100 through-holes connected via the conductor circuit 30 and through-hole lands 32.

Then, an interlayer resin insulating layer or layers and a conductor layer or layers are stacked alternately on the core substrate to form build-up wiring layers, thereby forming a multi-layered printed wiring board.

(7) After washing with water, acid degreasing, and then soft-etching the substrate above, an etching solution is applied on both sides of the substrate with a spray and the surface of the inner layer conductor circuit 30 (including the through-hole land 32) is etched to form a rough surface (not shown) on the entire surface of the inner layer conductor circuit 30 (including the through-hole land 32).

The etching solution (made by MEC, MEC Etch Bond) containing of 10 parts by weight of imidazole copper (II) complex, 7 parts by weight of glycol acid and 5 parts by weight of potassium chloride is used as the etching solution.

(8) On both sides of the substrate, a resin film for interlayer resin insulating (e.g., ABF made by Ajinomoto) which is slightly bigger than the substrate is positioned, preliminary pressure-bonded under the condition which is 0.4 MPa of pressure, 80° C. of temperature and 10 seconds of pressure bonding time, and cut, and then, laminated by using a vacuum laminating device to form an interlayer resin insulating layer 36 as follows.

The resin film for an interlayer resin insulating layer is permanently press-bonded on the substrate under the condition of 67 Pa of vacuum, 0.4 MPa of pressure, 80° C. of temperature, and 60 seconds of pressure bonding time and then thermally cured for 30 minutes at 170° C.

Figure 5A:
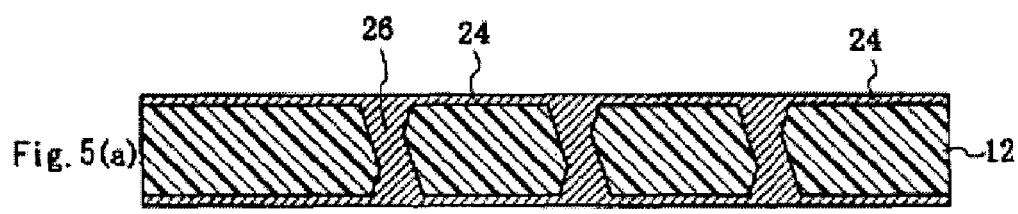
FIGS. 5(a) to (d) are cross-section views showing steps for producing a printed wiring board according to an embodiment of the present invention.
Figure 5B:
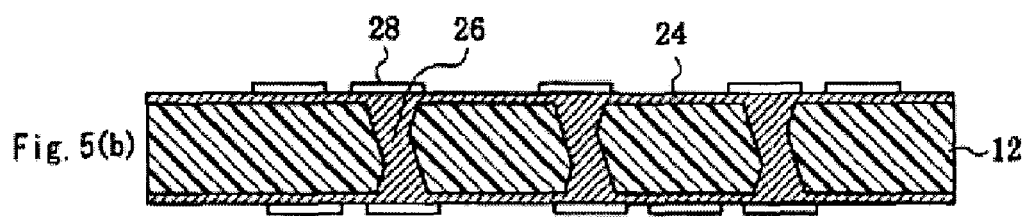
Figure 5C:
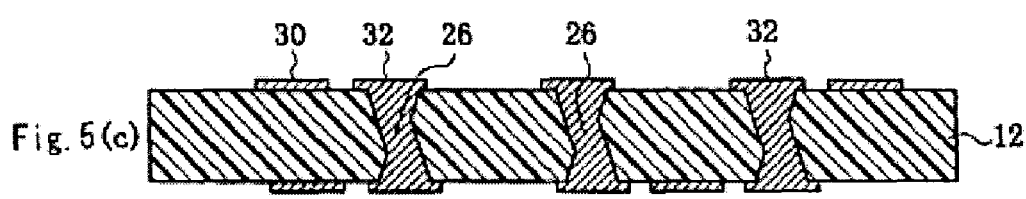
Figure 5D:
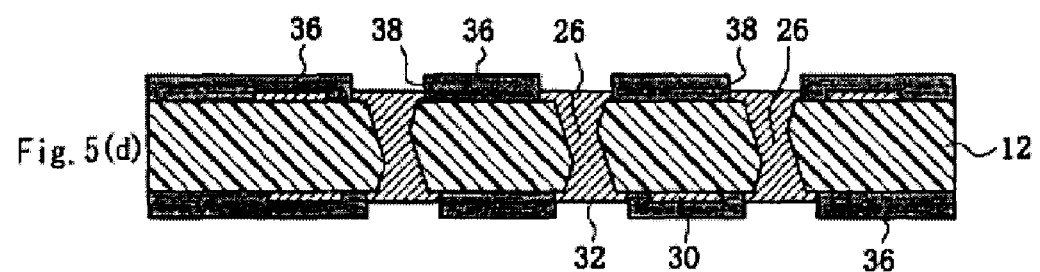

(9) Next, on the interlayer resin insulating layer 36, via a mask in which 1.2 mm thick of perforations are formed, with $CO_2$ gas laser of 10.4 μm wavelength, under the conditions of 4.0 mm of beam diameter, top hat mode, 8.0 μsec of pulse interval, 1.0 mm diameter of a mask perforation hole, and 1-3 shots, openings 38 for via holes with 60 μm diameter is formed in the interlayer resin insulating layer (refer to FIG. 5(d)).

(10) The substrate in which the openings 38 for via holes are performed is immersed in an 80° C. solution containing 60 g/l of hydrogen permanganate for 10 minutes to remove particles existing on the surface of the interlayer resin insulating layer 36, thus roughening the surface of the interlayer resin insulating layer 36 including the inner walls of the openings 38 for via holes (not shown).

(11) Then the substrate from the process above is immersed in a neutralization solution (made by Shipley) and washed in water.

In addition, on the surface of the substrate subjected the roughening process (rough depth of 3 μm), by applying palladium catalyst, catalyst nucleus are attached on the surface of the interlayer resin insulating layer 36 and the inner walls of the openings 38 for via holes (not shown). That is, the substrate above is immersed in the catalyst solution containing palladium chloride ($PdCl_2$) and stannous chloride ($SnCl_2$) and the catalyst is provided by separating out palladium metal.

(12) Next, the substrate with the catalyst is immersed in an electroless copper plating aqueous solution with the composition below to form an electroless copper plated film having a thickness of 0.6-3.0 μm on the entire rough surface, thus obtaining the substrate in which the electroless copper plated film (not shown) is formed on the surface of the interlayer resin insulating layer 36 including the inner walls of the openings 38 for via holes.

| Electrolysis copper plating aqueous solution | |
| --- | --- |
| Copper sulfate: | 0.03 mol/l |
| EDTA: | 0.200 mol/l |
| HCHO: | 0.18 g/l |
| NaOH: | 0.100 mol/l |
| α,α'-bipiridyl: | 100 mg/l |
| Polyethleneglycol: | 0.10 g/l |

| Plating condition | |
| --- | --- |
| Solution temperature: | 30-50° C. |
| Duration: | 40-60 minutes |

(13) A commercially available photosensitive dry film is laminated on the substrate with the electroless copper plated film and a mask is placed and exposed at 100 mJ/cm² and developed with 0.8% sodium carbonate aqueous solution to form a plated resists with a thickness of 20 μm (not shown).

(14) Next, after the substrate is washed with 50° C. water for degreasing, washed in 25° C. water, and then washed again with sulfuric acid, electrolysis plating is performed under the condition below to form an electrolysis plated film.

| Electrolysis plating solution | |
| --- | --- |
| Sulfuric acid: | 2.24 mol/l |
| Copper sulfate: | 0.26 mol/l |
| Additive agent: | 19.5 ml/l |
| Leveling agent: | 50 mg/l |
| Gloss agent: | 50 mg/l |

| Electrolysis plating condition | |
| --- | --- |
| Current density: | 1 A/dm² |
| Duration: | 65 minutes |
| Temperature: | 22 ± 2° C. |

In this plating process, an electrolytic copper plating film having a thickness of 20 μm is formed in the parts where plated resist is not formed, and also an electrolytic plated film is filled in the openings 38 for via holes.

(15) In addition, after the plated resist is removed with 5% KOH, the electroless plated film under the resist is dissolved and removed by the etching process with a mixed solution of sulfuric acid and hydrogen peroxide, thus forming filled vias 40 including via lands and an independent external layer conductor circuit 44 (refer to FIG. 6(*a*)).

(16) Then, a process same as (8) described above is performed to form a rough surface (not shown) on the surfaces of the filled vias 40 and the surface of the external layer conductor circuit 44.

(17) By repeating the steps from (8) to (15) described above, an interlayer insulating layer 46, a conductor circuit 48 and filled vias 50 are formed on further outside to obtain a multilayer wiring board (refer to FIG. 6(*b*)).

(18) Next, on both sides of the multilayer wiring board, a commercially available solder resist composition is coated for 20 µm thickness, and dried for 20 minutes at 70° C. and for 30 minutes at 70° C., a photo mask with 5 mm thick on which a solder resist opening pattern is drawn is closely attached on the solder resist layer, and the solder resist layer exposed to 1000 mJ/cm$^2$ of ultra violet beam, and then developed to form openings 54 whose diameter is 60 µm (refer to FIG. 6(*c*)).

Then, in addition, the solder resist layer is cured by subjecting to heating processes of one hour at 80° C., one hour for 100° C., one hour for 120° C., and three hours for 150° C. to form a solder resist pattern layer 52 with 20 µm thick and openings.

(19) Then, the substrate on which the solder resist layer 52 is formed is immersed in nonelectrolytic nickel plating solution containing nickel chloride (2.3×10$^{-1}$ mol/l), sodium hypophosphite (2.8×10$^{-1}$ mol/l), sodium citrate (1.6×10$^{-1}$ mol/l) at pH=4.5 for 20 minutes to form a nickel plated layer with 5 µm thick (not shown) at opening portions 54. In addition, the substrate is immersed in a nonelectrolytic plating solution containing potassium gold cyanide (7.6×10$^{-3}$ mol/l), ammonium chloride (1.9×10$^{-1}$ mol/l), sodium citrate (1.2× 10$^{-1}$ mol/l), and sodium hypophosphite (1.7×10$^{-1}$ mol/l) for 7.5 minutes at 80° C. to form a gold plated layer with 0.03 µm thick (not shown) on the nickel plated layer.

(20) In addition, on the opening 54 of the solder resist layer 52 on the side where an IC chip to be loaded, solder paste containing tin-lead is printed and on the opening 54 of the solder resist layer 52 on the other side, solder paste containing tin-antimony is printed, and then, by reflow at 230° C., the solder bumps 56 are formed, thus producing a multilayer printed wiring board (refer to FIG. 6(*d*)).

Example 1-2

Other than forming a penetrating-hole 20 with the out-of-alignment distance between the gravity centers of the first opening portion 16 and the second opening portion 18 to be 5 µm and the diameter of neck portion to be 76 µm by irradiating laser beam, a multiple layer printed wiring board is formed in a similar manner as Example 1-1.

Example 1-3

Other than forming a penetrating-hole 20 with the out-of-alignment distance between the gravity centers of the first opening portion 16 and the second opening portion 18 to be 10 µm and the diameter of neck portion to be 80 µm by irradiating laser beam, a multiple layer printed wiring board is formed in a similar manner as Example 1-1.

Example 1-4

Other than forming a penetrating-hole 20 with the out-of-alignment distance between the gravity centers of the first opening portion 16 and the second opening portion 18 to be 20 µm and the diameter of neck portion to be 91 µm by irradiating laser beam, a multiple layer printed wiring board is formed in a similar manner as Example 1-1.

Example 1-5

Other than forming a penetrating-hole 20 with the out-of-alignment distance between the gravity centers of the first opening portion 16 and the second opening portion 18 to be 25 µm and the diameter of neck portion to be 97 µm by irradiating laser beam, a multiple layer printed wiring board is formed in a similar manner as Example 1-1.

Example 1-6

Other than forming a penetrating-hole 20 with the out-of-alignment distance between the gravity centers of the first opening portion 16 and the second opening portion 18 to be 30 µm and the diameter of neck portion to be 110 µm by irradiating laser beam, a multiple layer printed wiring board is formed in a similar manner as Example 1-1.

Reference 1-1

Other than forming a penetrating-hole 20 with the out-of-alignment distance between the gravity centers of the first opening portion 16 and the second opening portion 18 to be 3 µm and the diameter of neck portion to be 74 µm by irradiating laser beam, a multiple layer printed wiring board is formed in a similar manner as Example 1-1.

Reference 1-2

Other than forming a penetrating-hole 20 with the out-of-alignment distance between the gravity centers of the first opening portion 16 and the second opening portion 18 to be 35 µm and the diameter of neck portion to be 95 µm by irradiating laser beam, a multiple layer printed wiring board is formed in a similar manner as Example 1-1.

Multilayer printed wiring boards of Examples 2-1 to 2-6 and References 2-1 to 2-2 are formed in similar manners as Examples 1-1 to 1-6 and References 1-1 to 1-2, using double-sided copper clad laminates in which the insulating resin substrates are 100 µm thick and other than setting the diameter of the first opening portion 16 and the second opening portion 18 as 75 µm, changing the opening diameter of the mask for laser and the conditions of the carbonic acid gas laser irradiation.

The out-of-alignment distances between axes of the gravity center and the diameters of the neck portions in those examples and references are listed in Table 1 and Table 2.

Also, multilayer printed wiring boards of Examples 3-1 to 3-6 and References 3-1 to 3-2 are formed in similar manners as Examples 1-1 to 1-6 and References 1-1 to 1-2, using double-sided copper clad laminates in which the insulating resin substrates are 500 µm thick and other than setting the diameter of the first opening portion 16 and the second opening portion 18 as 300 µm, changing the opening diameter of the mask for laser and the conditions of the carbonic acid gas laser irradiation.

The out-of-alignment distances between axes of the gravity center and the diameters of the neck portions in examples and references are listed in Table 2.

An evaluation test such as "A" described below is performed on the multilayer printed wiring boards produced according to Examples 1-1 to 3-6 and References 1-1 to 3-2 described above. The result of those evaluation tests are shown in Table 1 and Table 2.

A. Heat Cycle Test

The connection resistance of wiring that connects 100 through-holes through the conductor circuits on the front and back of the core substrate of a multilayer printed wiring board is measured (initial value), and then, under the heat cycle condition where a single cycle of −55° C. for 5 minutes and 125° C. for 5 minutes, a cycle test is repeated 1,000 times, and again the connection resistance is measured.

If the connection resistance variation (100×(the connection resistance value after the heat cycle−the initial value of connection resistance)/the initial value of connection resistance) is 10% or less, it is passed (indicated by "O") and if the connection resistance variation is beyond 10%, it is failed (indicated by "X").

As a result of the measurements, all examples passed while all reference examples failed.

For the core substrate of the multilayer printed wiring board in each reference example, the presence of any voids in plating filled in the penetrating-holes (through-holes) is observed using X-ray TV system (Shimadzu, product name "SMX-100"). 100 through-holes are selected randomly for the observation.

Many voids are confirmed in the core substrate in each reference example. It is believed that voids are formed when the out-of-alignment distance is small because the plating solution entering into the through-holes from the front and back of the core substrate is collided head-on. On the other hand, it is believed when the out-of-alignment distance is beyond 30 μm, the penetrating-holes are prone to deform as shown in FIGS. 7(a)-(b) because the out-of-alignment distance is too big.

TABLE 1

| | Board Thickness (μm) | First and second opening diameter (μm) | Misalignment of axis of the center of alignment (μm) | Neck portion diameter (μm) | Heat cycle test result |
|---|---|---|---|---|---|
| Example 1-1 | 300 | 150 | 15 | 87 | O |
| Example 1-2 | 300 | 150 | 5 | 76 | O |
| Example 1-3 | 300 | 150 | 10 | 80 | O |
| Example 1-4 | 300 | 150 | 20 | 91 | O |
| Example 1-5 | 300 | 150 | 25 | 97 | O |
| Example 1-6 | 300 | 150 | 30 | 110 | O |
| Reference 1-1 | 300 | 150 | 3 | 74 | X |
| Reference 1-2 | 300 | 150 | 35 | 95 | X |
| Example 2-1 | 100 | 75 | 15 | 37 | O |
| Example 2-2 | 100 | 75 | 5 | 24 | O |
| Example 2-3 | 100 | 75 | 10 | 30 | O |
| Example 2-4 | 100 | 75 | 20 | 40 | O |
| Example 2-5 | 100 | 75 | 25 | 45 | O |
| Example 2-6 | 100 | 75 | 30 | 49 | O |

TABLE 2

| | Board Thickness (μm) | First and second opening diameter (μm) | Misalignment of axis of the center of alignment (μm) | Neck portion diameter (μm) | Heat cycle test result |
|---|---|---|---|---|---|
| Reference 2-1 | 100 | 75 | 3 | 24 | X |
| Reference 2-2 | 100 | 75 | 35 | 40 | X |
| Example 3-1 | 500 | 300 | 15 | 162 | O |
| Example 3-2 | 500 | 300 | 5 | 156 | O |
| Example 3-3 | 500 | 300 | 10 | 160 | O |
| Example 3-4 | 500 | 300 | 20 | 161 | O |
| Example 3-5 | 500 | 300 | 25 | 168 | O |
| Example 3-6 | 500 | 300 | 30 | 170 | O |
| Reference 3-1 | 500 | 300 | 3 | 150 | X |
| Reference 3-2 | 500 | 300 | 35 | 160 | X |

From the result of the evaluation test A above, in the printed wiring board produced according to each example, it is confirmed that cracking is prevented around the center part in which the diameter plated through-hole decreases and that good electric connectivity and mechanical strength are obtained.

Figure 8:
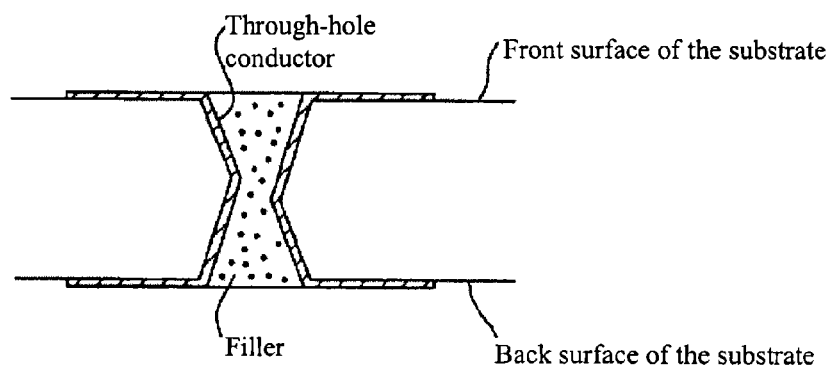
FIG. 8 is a cross-section view showing a through-hole made by filling filler into a space enclosed by through-hole conductor formed on the inner wall of a penetrating-hole according to an embodiment of the present invention.
Figure 9A:
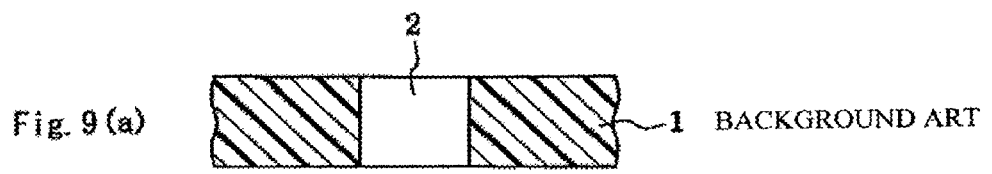
FIGS. 9(a) to (d) are cross-section views showing the production process of a printed wiring board according to a background art.
Figure 9B:
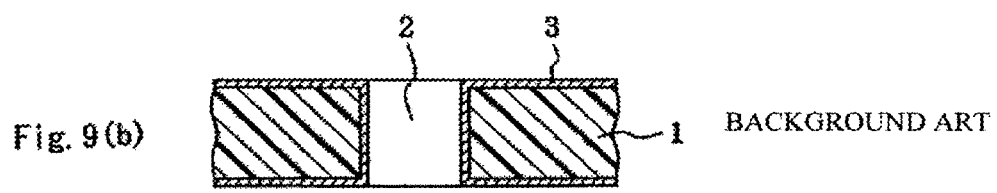
Figure 9C:
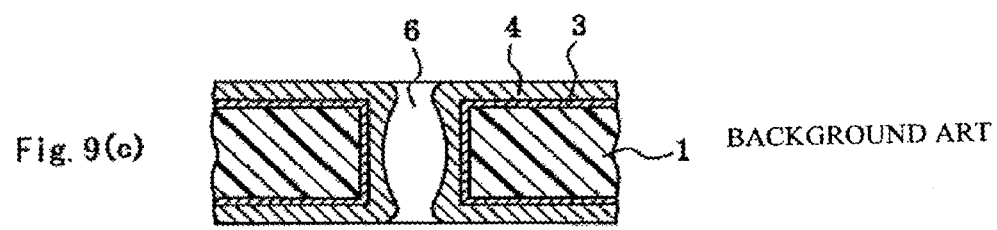
Figure 9D:
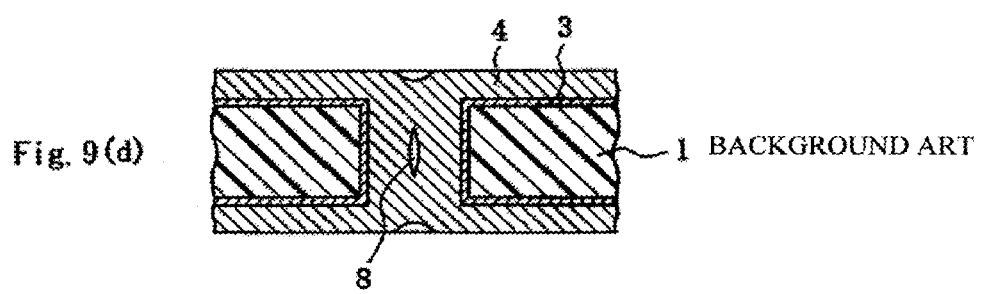
Figure 10:
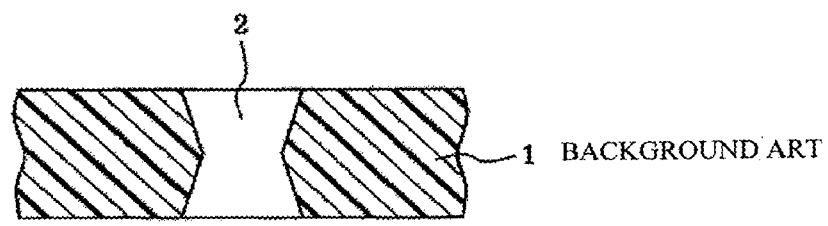
FIGS. 10(a) to (b) are cross-section views showing through-hole shapes on other printed wiring boards according to a background art.
Figure 10:
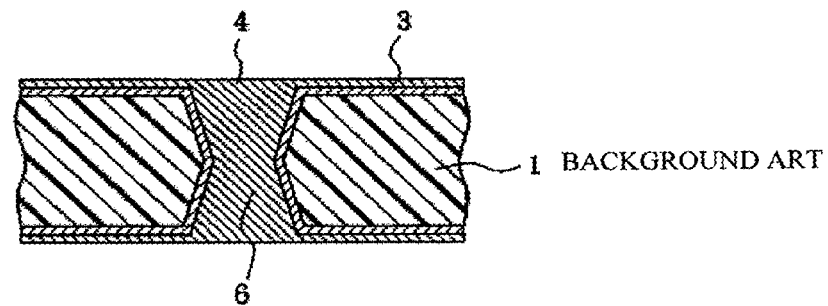

In each example described above, the penetrating-holes formed in the insulating resin substrate (core substrate) are filled with plating; however, the heat cycle test result is same for the amounts of the out-of-alignment even for through-holes (refer to FIG. 8) formed by forming through-hole conductors on inside walls of the penetrating-holes and then filling a filler in a gap enclosed by the through-hole conductors.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A printed wiring board comprising:
   an insulating resin substrate having a first surface and a second surface, the insulating resin substrate having at least one penetrating-hole passing through the insulating resin substrate from the first surface to the second surface;
   a first conductor formed on the first surface of the insulating resin substrate;
   a second conductor formed on the second surface of the insulating resin substrate; and
   a through-hole conductor structure formed in the penetrating-hole of the insulating resin substrate and electrically connecting the first conductor and the second conductor,
   wherein the penetrating-hole comprises a first opening portion having a first opening on the first surface and a first sidewall which decreases in diameter from the first opening toward the second surface, and a second opening portion having a second opening on the second surface and a second sidewall which decreases in diameter from the second opening toward the first surface, and wherein the first opening portion and the second opening portion are connected, with axes of the first opening portion and the second opening portion being offset from each other, and a rate of decrease in diameter of the first sidewall is substantially the same as a rate of decrease in diameter of the second sidewall.

2. The printed wiring board according to claim 1, wherein the first opening portion has a first axis of the center of gravity, the second opening portion has a second axis of the center of gravity, the first axis of the center of gravity being offset from the second axis of the center of gravity by an offset distance.

3. The printed wiring board according to claim 2, wherein the offset distance is 5 μm to 30 μm.

4. The printed wiring board according to claim 1, wherein the insulating resin substrate has a thickness which is 100 μm to 500 μm.

5. The printed wiring board according to claim 1, wherein the penetrating-hole has a neck portion connecting the first opening portion and second opening portion of the penetrating-hole, and each of the first sidewall and second sidewall of the penetrating-hole taper from respective openings on the first surface and second surface of the insulating resin substrate toward the neck portion.

6. The printed wiring board according to claim 5, wherein the first opening portion and second opening portion of the penetrating-hole have a diameter on the first surface and second surface of the insulating resin substrate of 75 μm to 300 μm, respectively, and the neck portion of the penetrating-hole has a diameter of 50 μm to 250 μm.

7. The printed wiring board according to claim 1, wherein the at least one penetrating-hole comprises a plurality of penetrating-holes, and the plurality of penetrating-holes are formed at a pitch of 100 μm to 400 μm.

8. The printed wiring board according to claim 1, wherein the through-hole conductor structure comprises a metal plating filling the penetrating-hole.

9. A printed wiring board comprising: a core substrate comprising an insulating resin substrate having a first surface and a second surface, the insulating resin substrate having at least one penetrating-hole passing through the insulating resin substrate from the first surface to the second surface, the core substrate further comprising a first inner conductor formed on the first surface of the insulating resin substrate, a second inner conductor formed on the second surface of the insulating resin substrate and a through-hole conductor structure formed in the penetrating-hole of the insulating resin substrate and electrically connecting the first conductor and the second conductor; a resin insulating layer formed over one of the first surface and second surface of the insulating resin substrate; and an external conductor circuit formed over the resin insulating layer and the core substrate, wherein the penetrating-hole comprises a first opening portion having an opening on the first surface and a first sidewall which decreases in diameter from the first opening toward the second surface, and a second opening portion having a second opening on the second surface and a second sidewall which decreases in diameter from the second opening toward the first surface, and wherein the first opening portion and the second opening portion are connected with axes of the first opening portion and the second opening portion being offset from each other, and a rate of decrease in diameter of the first sidewall is substantially the same as a rate of decrease in diameter of the second sidewall.

10. The printed wiring board according to claim 9, wherein the first opening portion has a first axis of the center of gravity, the second opening portion has a second axis of the center of gravity, the first axis of the center of gravity being offset from the second axis of the center of gravity by an offset distance.

11. The printed wiring board according to claim 9, wherein the offset distance is 5 μm to 30 μm.

12. The printed wiring board according to claim 9, wherein the insulating resin substrate has a thickness of 100 μm to 500 μm.

13. The printed wiring board according to claim 9, wherein the penetrating-hole has a neck portion connecting the first opening portion and second opening portion of the penetrating-hole, and each of the first sidewall and second sidewall of the penetrating-hole taper from respective openings on the first surface and second surface of the insulating resin substrate toward the neck portion.

14. The printed wiring board according to claim 13, wherein the first opening portion and second opening portion of the penetrating-hole have a diameter on the first surface and second surface of the insulating resin substrate of 75 μm to 300 μm, respectively, and the neck portion of the insulating resin substrate has a diameter of 50 μm to 250 μm.

15. The printed wiring board according to claim 9, wherein the at least one penetrating-hole comprises a plurality of penetrating-holes, and the plurality of penetrating-holes are formed at a pitch of 100 m to 400 μm.

16. The printed wiring board according to claim 9, wherein the through-hole conductor structure comprises a metal plating filling the penetrating-hole.

17. A manufacturing method for producing a printed wiring board, comprising: providing an insulating resin substrate having a first surface and a second surface; forming a first opening portion of a penetrating-hole having a first opening on the first surface of the insulating resin substrate and a first sidewall which decreases in diameter from the first opening toward the second surface; forming a second opening portion of the penetrating-hole having a second opening on the second surface of the insulating resin substrate and a second sidewall which decreases in diameter from the second opening toward the first surface and the second opening portion is connected to the first opening portion with axes of the first opening portion and the second opening portion being offset from each other, wherein a rate of decrease in diameter of the first sidewall is substantially the same as a rate of decrease in diameter of the second sidewall; forming a first conductor on the first surface of the insulating resin substrate; forming a second conductor on the second surface of the insulating resin substrate; and forming a through-hole conductor structure in the penetrating-hole of the insulating resin substrate to electrically connect the first conductor and the second conductor.

18. A printed circuit board produced by the manufacturing method according to claim 17.

19. The manufacturing method according to claim 17, wherein the forming of the first opening portion of the penetrating-hole comprises irradiating the first surface of the insulating resin substrate with a laser, and the forming of the second opening portion of the penetrating-hole comprises irradiating the second surface of the insulating resin substrate with a laser.

20. The manufacturing method according to claim 17, wherein the forming of the through-hole conductor structure comprises forming an electroless plated film on inner walls of the first opening portion and second opening portion of the penetrating-hole and forming an electrolytic plated layer over the electroless plated film.

* * * * *